(12) United States Patent
Numoto et al.

(10) Patent No.: US 11,058,031 B2
(45) Date of Patent: Jul. 6, 2021

(54) VAPOR CHAMBER

(71) Applicant: Murata Manufacturing Co., Ltd., Nagaokakyo (JP)

(72) Inventors: Tatsuhiro Numoto, Nagaokakyo (JP); Takuo Wakaoka, Nagaokakyo (JP); Atsushi Kishimoto, Nagaokakyo (JP); Osamu Chikagawa, Nagaokakyo (JP)

(73) Assignee: MURATA MANUFACTURING CO., LTD, Nagaokakyo (JP)

( * ) Notice: Subject to any disclaimer, the term of this patent is extended or adjusted under 35 U.S.C. 154(b) by 0 days.

(21) Appl. No.: 16/575,735

(22) Filed: Sep. 19, 2019

(65) Prior Publication Data
US 2020/0060044 A1 Feb. 20, 2020

Related U.S. Application Data

(63) Continuation of application No. PCT/JP2017/017043, filed on Apr. 28, 2017, and a
(Continued)

(51) Int. Cl.
*H05K 7/20* (2006.01)
*F28D 15/04* (2006.01)
*H01L 23/427* (2006.01)

(52) U.S. Cl.
CPC ......... *H05K 7/20336* (2013.01); *F28D 15/04* (2013.01); *H01L 23/427* (2013.01)

(58) Field of Classification Search
CPC .... F28D 15/0233; F28D 15/04; F28D 15/046; H01L 23/437; G06F 1/203; H05K 7/20336
See application file for complete search history.

(56) References Cited

U.S. PATENT DOCUMENTS 6,082,443 A 7/2000 Yamamoto et al.
6,508,302 B2 * 1/2003 Ishida ................... B21C 37/151
165/104.21
(Continued)

FOREIGN PATENT DOCUMENTS

CN 101133295 A 2/2008
CN 100437005 C * 11/2008 ......... F28D 15/0233
(Continued)

OTHER PUBLICATIONS

International Search Report issued in PCT/JP2017/017043, dated Jul. 25, 2017.
(Continued)

*Primary Examiner* — Robert J Hoffberg
(74) *Attorney, Agent, or Firm* — Arent Fox LLP

(57) ABSTRACT

A vapor chamber that includes a housing composed of a first sheet and a second sheet facing each other and having outer edge portions thereof joined to each other to define an internal space, the second sheet having a plurality of projecting portions on an inner surface thereof that faces the internal space; a pillar between the first sheet and the second sheet and supporting them from the internal space; a wick arranged in the housing, and a working fluid enclosed in the housing. A first flow path and a second flow path are formed in the internal space, and a cross-sectional area of the second flow path is larger than a cross-sectional area of the first flow path.

14 Claims, 2 Drawing Sheets

Related U.S. Application Data continuation of application No. PCT/JP2018/016939, filed on Apr. 26, 2018.

(56) References Cited

U.S. PATENT DOCUMENTS

| | | | | |
|---|---|---|---|---|
| 6,725,910 | B2* | 4/2004 | Ishida | B21C 37/151 |
| | | | | 165/104.21 |
| 6,871,701 | B2* | 3/2005 | Ueki | F28D 15/0233 |
| | | | | 165/104.26 |
| 10,036,597 | B2* | 7/2018 | De Troz | H01L 23/427 |
| 10,667,430 | B2* | 5/2020 | Inagaki | H05K 7/20336 |
| 10,886,601 | B2* | 1/2021 | Ishizuka | H01Q 1/48 |
| 10,959,357 | B2* | 3/2021 | Tamayama | G06F 1/163 |
| 2002/0189793 | A1* | 12/2002 | Noda | F28D 15/046 |
| | | | | 165/104.26 |
| 2005/0126759 | A1* | 6/2005 | Ueki | F28D 15/0283 |
| | | | | 165/104.21 |
| 2007/0056711 | A1 | 3/2007 | Ohsawa | |
| 2008/0135214 | A1 | 6/2008 | Ohsawa et al. | |
| 2008/0185128 | A1* | 8/2008 | Moon | F28D 15/046 |
| | | | | 165/104.26 |
| 2011/0203777 | A1* | 8/2011 | Zhao | F28D 15/0283 |
| | | | | 165/104.26 |
| 2013/0037242 | A1* | 2/2013 | Chen | F28D 15/0233 |
| | | | | 165/104.26 |
| 2016/0131438 | A1 | 5/2016 | De Troz | |
| 2019/0141855 | A1 | 5/2019 | Inagaki et al. | |
| 2020/0003499 | A1* | 1/2020 | Kume | F28D 15/0233 |
| 2020/0003501 | A1* | 1/2020 | Wakaoka | F28D 15/046 |

FOREIGN PATENT DOCUMENTS

| | | | | |
|---|---|---|---|---|
| CN | 101639331 A | | 2/2010 | |
| CN | 101614499 B | | 9/2010 | |
| CN | 102538528 B | * | 10/2013 | ........... F28D 15/046 |
| CN | 203337002 U | | 12/2013 | |
| CN | 105452795 A | | 3/2016 | |
| JP | S54108050 A | | 8/1979 | |
| JP | H1137679 A | | 2/1999 | |
| JP | 2001165584 A | * | 6/2001 | ......... F28D 15/0233 |
| JP | 2003314979 A | | 11/2003 | |
| JP | 3113254 U | | 9/2005 | |
| JP | 2007183021 A | | 7/2007 | |
| JP | 2013002640 A | | 1/2013 | |
| JP | 2014062658 A | | 4/2014 | |
| JP | 2015087089 A | | 5/2015 | |
| WO | 2008146129 A2 | | 12/2008 | |
| WO | WO-2015014929 A1 | * | 2/2015 | ........... F28D 15/046 |
| WO | 2018003957 A1 | | 1/2018 | |

OTHER PUBLICATIONS

Written Opinion of the International Searching Authority issued in PCT/JP2017/017043, dated Jul. 25, 2017.

International Search Report issued in PCT/JP2018/016939, dated Jul. 10, 2018.

Written Opinion of the International Searching Authority issued in PCT/JP2018/016939, dated Jul. 10, 2018.

* cited by examiner

VAPOR CHAMBER

CROSS REFERENCE TO RELATED APPLICATIONS

The present application is a continuation of International application No. PCT/JP2017/017043, filed Apr. 28, 2017, the entire contents of which are incorporated herein by reference; and the present application is a continuation of International application No. PCT/JP2018/016939, filed Apr. 26, 2018, which claims priority to International application No. PCT/JP2017/017043, filed Apr. 28, 2017, the entire contents of each of which are incorporated herein by reference.

FIELD OF THE INVENTION

The present invention relates to a vapor chamber.

BACKGROUND OF THE INVENTION

In recent years, a heat generation amount is increased due to high integration and high performance of an element. Further, a heat generation density is increased with size reduction of a product, so that heat radiation measures have become important. This situation is particularly prominent in the field of mobile terminals such as smart phones and tablets. In recent years, although a graphite sheet or the like is often used as a heat countermeasure member, the heat transportation amount thereof is not sufficient. Therefore, use of various heat countermeasure members has been investigated. Among them, use of a vapor chamber, which is a planar heat pipe, has been studied as it is possible for the vapor chamber to transport heat very effectively.

The vapor chamber has the configuration in which a wick for transporting a working fluid by capillary force and the working fluid are enclosed inside a housing. The working fluid absorbs heat from a heat generation element in an evaporation portion which absorbs heat from the heat generation element, evaporates in the vapor chamber, moves to a condensation portion, and is cooled to return to a liquid phase. The working fluid which has returned to the liquid phase is moved to the heat generation element side (evaporation portion) again by the capillary force of the wick and cools the heat generation element. By repeating this operation, the vapor chamber can operate autonomously without having external power and can diffuse heat two dimensionally at high speed by utilizing evaporation latent heat and condensation latent heat of the working liquid.

As the vapor chamber as described above, Patent Document 1 discloses a plate vapor chamber (heat pipe) including a sealed hollow portion formed by an upper plate member and a lower plate member facing each other and having a wick (capillary structure) in the hollow portion.

Patent Document 1: Japanese Unexamined Patent Application Publication No. 2003-314979

SUMMARY OF THE INVENTION

In the vapor chamber having the wick described in Patent Document 1, the wick makes contact with the lower plate member (see FIG. 4 in Patent Document 1) or is located at the center between the upper plate member and the lower plate member (see FIG. 5 in Patent Document 1). In the former configuration, since there is no portion for holding the working fluid other than the wick, the holding amount of the working fluid is reduced and heat transportation capacity as a whole is inferior. In the latter configuration, either of a space above the wick or a space below the wick can be used as a vapor flow path for the working fluid, and the other thereof can be used as a holding portion for the working fluid. In such a configuration, although a water retention amount is increased, the vapor flow path becomes narrow and the capillary force is less likely to act in the holding portion for the working liquid, so that the heat transportation capacity as a whole is inferior.

It is an object of the present invention to provide a vapor chamber capable of holding a sufficient amount of working fluid and having excellent heat transportation capacity.

As a result of extensive studies to solve the above problems, the inventors of the present invention have found the following and have achieved the present invention. That is, in a vapor chamber having a housing composed of two sheets facing each other and a wick inside the housing, a plurality of projecting portions is provided on the inner surface of the sheet, and a second flow path which is larger than a first flow path formed between the projecting portions is formed in a terminal region inside the housing, thereby obtaining the vapor chamber having the large holding amount of a working fluid and high heat transportation capacity.

According to a first aspect of the invention, there is provided a vapor chamber that includes a housing composed of a first sheet and a second sheet facing each other and having outer edge portions thereof joined to each other to define an internal space, the second sheet having a plurality of projecting portions on an inner surface thereof that faces the internal space; a pillar between the first sheet and the second sheet and supporting the first sheet and the second sheet from the internal space; the wick arranged in the internal space of the housing; and a working fluid enclosed in the internal space of the housing. A first flow path is formed between the projecting portions adjacent to each other together with the wick, a second flow path is formed in a terminal region between the pillar and the joined outer edge portions along at least one side of the housing by the second sheet, the projecting portions, and the wick, and a cross-sectional area of the second flow path is larger than a cross-sectional area of the first flow path.

According to a second aspect of the invention, there is provided a heat dissipation device including the above-described vapor chamber.

According to a third aspect of the invention, there is provided an electronic apparatus including the above-described vapor chamber or the above-described heat dissipation device, in which a heat source of the electronic apparatus is arranged at a position which does not overlap with the second flow path of the vapor chamber in a plan view.

It is an object of the present invention to provide the vapor chamber with high heat transportation capacity having the housing composed of the two sheets facing each other and the wick arranged at a height equivalent to a joint portion inside the housing, in which the plurality of projecting portions is provided on the inner surface of the sheet, and the second flow path which is larger than the first flow path formed between the projecting portions is formed in the terminal region inside the housing.

DETAILED DESCRIPTION OF THE PREFERRED EMBODIMENTS

Hereinafter, a vapor chamber of the invention will be described in detail with reference to the drawings.

Figure 1:
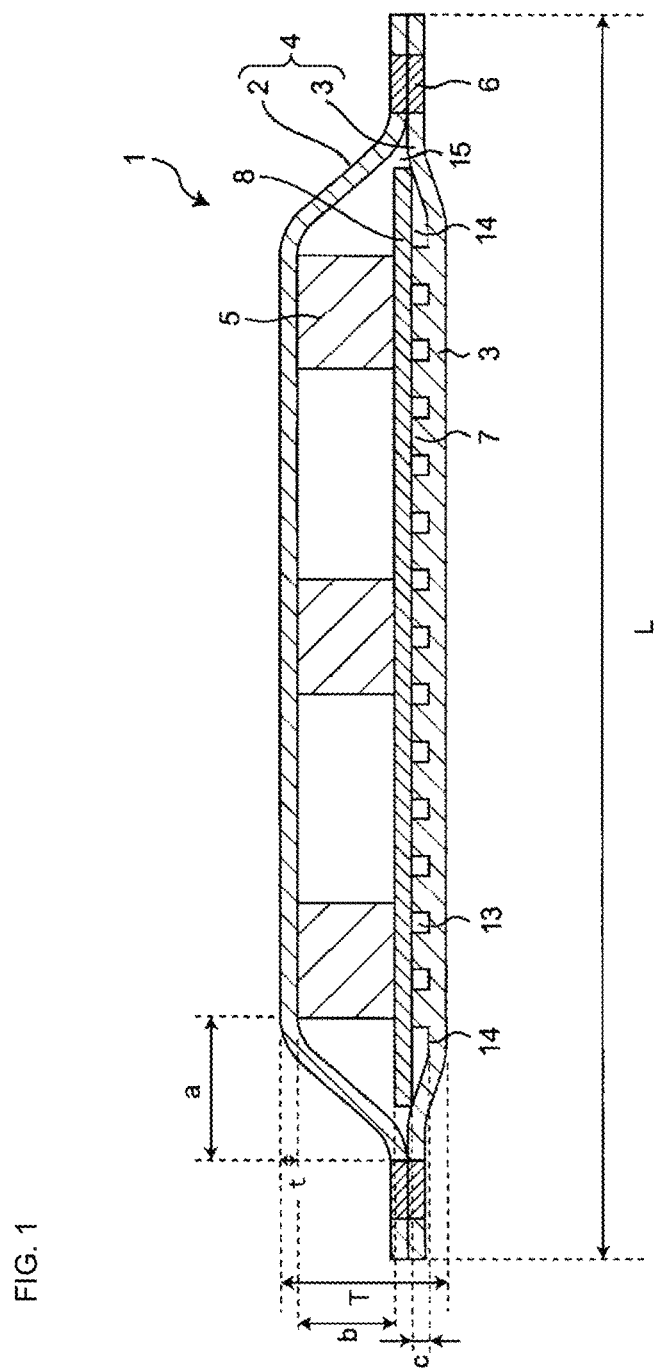
FIG. 1 is a cross-sectional view schematically illustrating a cross section of a vapor chamber 1 in one embodiment of the invention.
Figure 2:
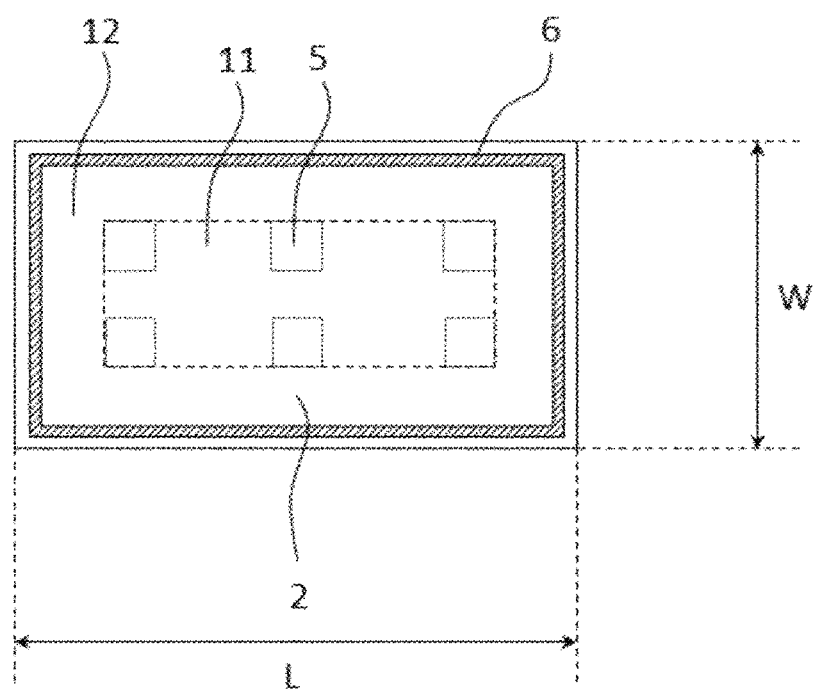
FIG. 2 is a plan view schematically illustrating the vapor chamber 1 in the embodiment of the invention when seen from a first sheet side.

As illustrated in FIGS. 1 and 2, a vapor chamber 1 in the embodiment has a housing 4 composed of a first sheet 2 and a second sheet 3 facing each other and a working fluid (not illustrated) enclosed therein. In order to ensure an internal space in the housing 4, a plurality of pillars 5 are provided between the first sheet 2 and the second sheet 3 so as to support them from the inner side thereof. The first sheet 2 and the second sheet 3 are supported by the pillars 5 in a region 11 (hereinafter, also referred to as a "central region") in an inner side portion of a line connecting the pillars 5 existing on the edge side and are separated from each other by a predetermined distance. The first sheet 2 and the second sheet 3 are curved and brought close to each other in an outer side portion relative to the central region 11, which is a region 12 (hereinafter, also referred to as a "terminal region"), and make contact with each other, are joined together, and are sealed at outer edge portions. A portion 6 in which the first sheet and the second sheet are joined together is hereinafter also referred to as a "joint portion", and a surface in which the first sheet and the second sheet make contact with each other in the joint portion is also referred to as a joint surface. In other words, the first sheet 2 and the second sheet 3 are typically brought close to each other from the edges of the pillars 5 closest to edges of the sheets and are joined together and sealed in the joint portion 6 located at the outer edge portions of the sheets. The second sheet 3 has a plurality of projecting portions 7 on the inner surface thereof (that is, the main surface thereof on the side of the internal space of the housing). A wick 8 is arranged in the internal space of the housing 4. The projecting portions 7 form a first flow path 13 between the projecting portions adjacent to each other together with the wick 8. Further, the second sheet 3, the projecting portions 7, and the wick 8 form a second flow path 14 in the terminal region.

The housing 4 is composed of the first sheet 2 and the second sheet 3 facing each other.

The size of the housing 4 is not particularly limited. The thickness (denoted by a reference symbol T in FIG. 1) of the housing 4 may be preferably 100 μm to 600 μm, and more preferably 200 μm to 500 μm. The length (denoted by a reference symbol L in FIGS. 1 and 2) and the width (denoted by a reference symbol W in FIG. 2) of the housing 4 can be appropriately set depending on applications and may be, for example, 5 mm to 500 mm, 20 mm to 300 mm, or 50 mm to 200 mm.

The shape of the housing 4 is not particularly limited. For example, the planar shape (shape illustrated in FIG. 2, that is, shape when seen from above in FIG. 1) of the above-described housing 4 may be a polygonal shape such as a triangle and a rectangle, a circle, an ellipse, a combination thereof, or the like.

Materials forming the first sheet 2 and the second sheet 3 are not particularly limited as long as they have characteristics suitable for use as a vapor chamber, for example, they have thermal conductivity, strength, flexibility, and the like. The materials forming the first sheet 2 and the second sheet 3 are preferably metal. The materials may be, for example, copper, nickel, aluminum, magnesium, titanium, iron, or an alloy containing any of them as a main component thereof, and particularly preferably copper. Although the materials forming the first sheet 2 and the second sheet 3 may be the same as or different from each other, they are preferably the same.

The thicknesses (denoted by a reference symbol t in FIG. 1) of the first sheet 2 and the second sheet 3 are not particularly limited but may be preferably 10 μm to 200 μm, and more preferably 30 μm to 100 μm. They may be, for example, preferably equal 40 μm to 60 μm.

In the embodiment, the second sheet 3 has the plurality of projecting portions 7 on the main surface thereof on the internal space side. Since the second sheet has the plurality of projecting portions, the working fluid can be held between the projecting portions, so that the amount of the working fluid in the vapor chamber of the invention can be easily increased. By increasing the amount of the working fluid, heat transportation capacity of the vapor chamber is improved. Here, the projecting portions indicate relatively higher portions than the surroundings and also include relatively higher portions with recess portions formed in the main surface, for example, grooves or the like in addition to portions protruding from the main surface.

The heights of the projecting portions 7 are not particularly limited but may be preferably 1 μm to 100 μm, more preferably 5 μm to 50 μm, and still more preferably 15 μm to 30 μm. Increase in the heights of the projecting portions can increase the holding amount of the working fluid. Decrease in the heights of the projecting portions can ensure a wider space for movement of the vapor of the working fluid. Accordingly, by adjusting the heights of the projecting portions, it is possible to adjust the heat transportation capacity of the vapor chamber.

The widths of the projecting portions are not particularly limited but may be preferably 1 μm to 500 μm, more preferably 5 μm to 300 μm, and still more preferably 15 μm to 150 μm. Decrease in the widths of the projecting portions can arrange a larger number of projecting portions and further increase the capillary force by the projecting portions. Increase in the widths of the projecting portions can increase the strength of the projecting portions.

The projecting portions 7 form the first flow path 13 between the projecting portions adjacent to each other together with the wick 8. That is, the first flow path is formed between the adjacent projecting portions. The first flow path generates the capillary force in addition to a function of holding the working fluid.

Distances between the projecting portions 7 are not particularly limited but may be preferably 1 μm to 500 μm, more preferably 5 μm to 300 μm, and still more preferably 15 μm to 150 μm. Decrease in the distances between the projecting portions can further increase the capillary force. Increase in the distances between the projecting portions can further increase the holding amount of the working fluid.

The second sheet, the projecting portions, and the wick form the second flow path 14 in the terminal region. That is, as illustrated in FIG. 1, the second flow path 14 is a region surrounded by the projecting portions located closest to the joint portion, end portions of the wick, and the second sheet curved toward the joint surface. The above-described second flow path generates capillary force in addition to a function of holding the working fluid. Although the wick and the projecting portions and the wick and the second sheet completely make contact with each other in FIG. 1, the wick and the projecting portions and the wick and the second sheet may be separated from each other as long as the flow path can be formed. That is, the wick and the projecting portions and the wick and the second sheet may be separated from each other to such an extent that the working fluid is held by surface tension thereof.

Distances between the wick and the projecting portions forming the second flow path and distances between wick terminals and the second sheet may be independently preferably 0 μm to 500 μm, more preferably equal to or less than 300 μm, and still more preferably equal to or less than 100 μm. In a preferred mode, the wick and the projecting portions forming the second flow path and the wick and the second sheet make contact with each other, i.e., the distances between the wick and the projecting portions forming the second flow path and the distance between the wick and the second sheet are 0.

The cross-sectional area of the second flow path is larger than the cross-sectional area of the first flow path. The cross-sectional area of the second flow path may be preferably 1.1 times or more, more preferably 2 times or more, much more preferably 5 times or more, and still more preferably 10 times or more larger than the cross-sectional area of the first flow path. The upper limit of the cross-sectional area of the second flow path is not particularly limited so long as the second flow path can exert the capillary force, but may be, for example, equal to or less than 50 times, and preferably equal to or less than 30 times larger than the cross-sectional area of the first flow path. For example, the cross-sectional area of the second flow path is equal to or less than 20 times larger than the cross-sectional area of the first flow path. By making the second flow path larger than the cross-sectional area of the first flow path, the second flow path can hold a larger amount of the working fluid than that help by the first flow path.

Here, the cross-sectional area of the first flow path can be measured in a front view of a cut surface of the vapor chamber. Although there is no particular limitation on a cutting place, measurement is carried out at the outer edge of the wick in the vapor chamber 1 of the present disclosure.

It is sufficient that the second flow path is present in a part of the terminal region, but the second flow path is preferably present in the terminal region on at least one side of the vapor chamber, more preferably in the terminal regions on two sides, and particularly preferably in the terminal region overall.

By forming the second flow path having the larger holding amount of the working fluid than that of the first flow path in the terminal region as described above, it is possible to arrange a heat source at a position away from the second flow path. Thus, the working fluid changes from gas into liquid near the second flow path. Since the second flow path is capable of holding the larger amount of the working fluid, it is possible to efficiently hold the working fluid in the form of liquid. In addition, the first flow path having a relatively small cross-sectional area has strong capillary force and can transport the working fluid held in the second flow path to the heat source more efficiently. Therefore, the vapor chamber of the invention has high heat transportation capacity as a whole.

The shapes of the projecting portions 7 are not particularly limited but may be cylindrical shapes, prismatic shapes, truncated cone shapes, truncated pyramid shapes, or the like. The shapes of the projecting portions 7 may be wall shapes, that is, such shapes that grooves are formed between the projecting portions adjacent to each other.

As noted above, the first sheet 2 and the second sheet 3 are joined to each other at the outer edge portions thereof. A method of joining them is not particularly limited, but for example, laser welding, resistance welding, diffusion bonding, brazing, TIG welding (tungsten-inert gas welding), ultrasonic bonding, or resin sealing can be used and the laser welding, the resistance welding, or the brazing can be preferably used.

The pillars 5 support the first sheet 2 and the second sheet 3 from the inner side such that a distance between the first sheet and the second sheet is a predetermined distance. By arranging the pillars 5 inside the housing 4, deformation of the housing can be suppressed when the inside of the housing is depressurized, when external pressure is applied from the outside of the housing, and the like. When the pillars support the first sheet and the second sheet, the pillars may support the sheets while making direct contact with the sheets or may support the sheets with another member, for example, the wick or the like, interposed therebetween.

A material forming the pillars 5 is not particularly limited but is, for example, metal. The material may be, for example, copper, nickel, aluminum, magnesium, titanium, iron, an alloy containing any of them as a main component thereof, or the like and be particularly preferably copper. In a preferred mode, the material forming the pillars is the same material as either of the first sheet or the second sheet or both of them.

The heights of the pillars 5 can be appropriately set in accordance with a desired thickness of the vapor chamber and are preferably 50 μm to 500 μm, more preferably 100 μm to 400 μm, and still more preferably 100 μm to 200 μm. The heights thereof are, for example, 125 μm to 150 μm. Here, the heights of the pillars indicate the heights thereof in the thickness direction of the vapor chamber (the heights thereof in the up-down direction in FIG. 1).

The shapes of the pillars 5 are not particularly limited but may be cylindrical shapes, prismatic shapes, truncated cone shapes, truncated pyramid shapes, or the like.

The thicknesses of the pillars 5 are not particularly limited as long as the pillars 5 give strength capable of suppressing deformation of the housing of the vapor chamber. For example, circle-equivalent diameters of cross sections of the pillars, which are perpendicular to the height direction, may be 100 μm to 2000 μm, and preferably 300 μm to 1000 μm. Increase in the circle-equivalent diameters of the pillars can further suppress the deformation of the housing of the vapor chamber. Decrease in the circle-equivalent diameters of the pillars can ensure a wider space for movement of the vapor of the working fluid.

The arrangement of the pillars 5 is not particularly limited, but the pillars 5 are arranged preferably uniformly. The pillars 5 are arranged, for example, in a grid form such that distances between the pillars 5 are constant. By uniformly arranging the pillars, uniform strength can be ensured throughout the vapor chamber.

The number and intervals of the pillars 5 are not particularly limited, but the number thereof may be preferably 0.125 to 0.5, and more preferably 0.2 to 0.3 per 1 $mm^2$ of the area of the main surface of one sheet defining the internal space of the vapor chamber. Increase in the number of the pillars can further suppress the deformation of the vapor chamber (or the housing). Decrease in the number of the pillars can ensure a wider space for the movement of the vapor of the working fluid.

The pillars 5 may be formed integrally with the first sheet or may be fixed at predetermined positions on the first sheet after they are manufactured separately from the first sheet.

The working fluid is not particularly limited as long as it can undergo gas-liquid phase change under an environment in the housing. For example, water, alcohol, substitute freon, or the like can be used therefor. In one mode, the working fluid is aqueous compound and is preferably water.

The wick 8 is not particularly limited as long as it has a structure in which the working fluid can be moved by the capillary force. A capillary structure exerting the capillary force for moving the working fluid is not particularly limited and may be a well-known structure used in an existing vapor chamber. Examples of the capillary structure include a microstructure having irregularities such as pores, grooves, and protrusions, for example, a fiber structure, a groove structure, a network structure, and the like.

The thickness of the wick 8 is not particularly limited but may be, for example, 5 μm to 200 μm, preferably 10 μm to 80 μm, and more preferably 30 μm to 50 μm.

A distance between the ends of the wick 8 and the joint portion 6 is not particularly limited but may be, for example, equal to or less than 200 μm, preferably equal to or less than 100 μm, and more preferably equal to or less than 30 μm.

In one mode, the wick 8 makes contact with the joint portion 6. By extending the wick to the joint portion as far as possible, the heat transportation capacity is further improved.

In another mode, the wick 8 is slightly spaced from the joint portion 6. The distance between the wick 8 and the joint portion 6 is not particularly limited as long as it is a distance that enables the working fluid to be held therein. By slightly spacing the wick 8 from the joint portion 6, a third flow path 15 is formed by the first sheet, the second sheet, and the wick in an inner side portion relative to the joint portion of the first sheet and the second sheet. The third flow path generates capillary force in addition to a function of holding the working fluid. Note that the wick and the first sheet and the wick and the second sheet may make contact with each other or be separated from each other as long as flow path can be formed thereby.

The size and shape of the wick 8 are not particularly limited, but the wick 8 preferably has, for example, such size and shape that it can be continuously installed from an evaporation portion to a condensation portion inside the housing.

In the vapor chamber 1 of the first embodiment, the first sheet 2, the second sheet 3, the pillars 5, and the wick 8 described above are stacked in the order of the second sheet 3, the wick 8, the pillars 5, and the first sheet 2. The first sheet 2 and the second sheet 3 are brought close to each other toward the edges of the sheets in the terminal region 12 and make contact with each other, are joined together, and are sealed at the outer edge portions. Each of the first sheet and the second sheet is curved in order to be brought close to the other sheet in the terminal region. In a preferred mode, in the terminal region, the first sheet and the second sheet are not bent with an angle, specifically at an angle of equal to or less than 90°, preferably equal to or less than 100°, and more preferably equal to or less than 110°.

The wick 8 is preferably arranged at a height equivalent to the joint surface of the first sheet and the second sheet. Here, the height of the wick means a height at the center thereof in the thickness direction of the wick, in other words, a height of a plane (hereinafter, referred to as a "central plane") which is equidistant from the two main surfaces of the wick. In one mode, the central plane of the wick is located in a range of ±30 μm from the plane including the joint surface of the first sheet and the second sheet in the up-down direction (i.e., a region having the thickness of 60 μm with the plane including the joint surface as the center), preferably in a range of ±20 μm in the up-down direction, and more preferably in a range of ±5 μm in the up-down direction. In a preferred mode, the central plane of the wick is located at the same height as the plane including the joint surface of the first sheet and the second sheet.

The wick 8 is arranged such that a distance between the main surface of the wick on the second sheet side and the inner main surface of the second sheet is preferably 1 μm to 100 μm, more preferably 5 μm to 50 μm, and still more preferably 15 μm to 30 μm.

The wick 8 is arranged such that a distance between the main surface of the wick on the second sheet 3 side and the upper surfaces of the projecting portions 7 on the second sheet is preferably equal to or less than 100 μm, more preferably equal to or less than 30 μm, and still more preferably equal to or less than 10 μm. In a preferred mode, the distance between the main surface of the wick on the second sheet 3 side and the upper surfaces of the projecting portions 7 on the second sheet is 0 μm, that is, the wick and the projecting portions make contact with each other.

In the vapor chamber of the invention, at a position at which the sheets start deformation, a distance between the first sheet and the wick is larger than a distance between the second sheet and the wick. By arranging the wick to be closer to the second sheet as described above, a large vapor flow path can be ensured between the wick and the first sheet, and further, the working fluid can be held between the wick and the second seat. Decrease in the distance between the wick and the second sheet can increase the capillary force acting between the wick and the second sheet. In particular, in the vicinity of the joint portion, the capillary force becomes larger.

The "position at which the sheets start deformation" means a position at which either or both of the first sheet and the second sheet start(s) deformation toward the other sheet for joint. Typically, the "position at which the sheets start deformation" is the boundary between the central region 11 and the terminal region 12. The "distance between the first sheet and the wick" indicates a distance from the inner main surface of the first sheet to the main surface of the wick, which faces the main surface. Similarly, the "distance between the second sheet and the wick" indicates a distance from the inner main surface of the second sheet to the main surface of the wick, which faces the main surface. In the case where projecting portions or recess portions are present on the inner main surface of the first sheet or the second sheet, the above-mentioned distances are defined using, as a reference, the surface assuming neither of the projecting portion nor the recess portion.

When the distance (μm) from the position at which the sheets start the deformation to the terminal of the joint portion is "a", the distance (μm) between the first sheet and the wick at the position at which the sheets start the deformation is "b", and the distance (μm) between the second sheet and the wick is "c", the vapor chamber of the invention satisfies $b/a > c/a$ and the following equations 1 and 2.

$$0.001 \leq b/a \leq 1.000 \qquad \text{Equation 1}$$

$$0.001 \leq c/a\ 0.200 \qquad \text{Equation 2}$$

By satisfying the above equations 1 and 2, higher heat transportation capacity can be achieved.

In a preferred mode, the vapor chamber of the invention satisfies the following equations 1' and 2'.

$$0.020 \leq b/a \leq 0.400 \qquad \text{Equation 1'}$$

$$0.001 \leq c/a \leq 0.050 \qquad \text{Equation 2'}$$

In a further preferred mode, the vapor chamber of the invention satisfies the following equations 1" and 2".

$$0.050 \leq b/a \leq 0.100 \quad \text{Equation 1"}$$

$$0.006 \leq c/a \leq 0.020 \quad \text{Equation 2"}$$

The above-described symbol "a" is preferably 500 μm to 10000 μm, more preferably 1000 μm to 5000 μm, and still more preferably 1500 μm to 2500 μm.

The above-described symbol "b" is preferably 5 μm to 500 μm, more preferably 100 μm to 400 μm, much more preferably 100 μm to 200 μm, and still more preferably 125 μm to 150 μm.

The above-described symbol "c" is preferably 1 μm to 100 μm, more preferably 5 μm to 50 μm, and still more preferably 15 μm to 30 μm.

Although the vapor chamber of the invention has been described above with reference to the above-described embodiment, the vapor chamber of the invention is not limited to the mode illustrated in the drawings, and various modifications may be made.

For example, a vapor chamber in another mode may also have projecting portions on the inner main surface of the first sheet 2.

A vapor chamber in still another mode may have recess portions instead of the projecting portions on the inner main surface of one or both of the first sheet 2 and the second sheet 3.

A vapor chamber in still another mode may further include a wick on the first sheet 2. In this case, the pillars 5 may support the first sheet 2 with the above-described wick interposed therebetween without making direct contact with the first sheet 2.

Since the vapor chamber of the invention has the high heat transportation capacity as described above, the vapor chamber is suitably used for a heat dissipation device.

Accordingly, the invention also provides a heat dissipation device including the vapor chamber of the invention.

The vapor chamber of the invention is advantageous for miniaturization (particularly, reduction in thickness) and is suitable for use in an apparatus, such as an electronic apparatus, which is required to be miniaturized.

Accordingly, the invention also provides an electronic apparatus including the vapor chamber of the invention or the heat dissipation device of the invention.

In the vapor chamber of the invention, the second flow path present in the terminal region and the third flow path if present can hold a large amount of the working fluid. Therefore, when the vapor chamber of the invention is used in the heat dissipation device, it is preferable that the working fluid be liquefied near the second flow path and the third flow path if present. Accordingly, it is preferable that the heat source be arranged at a position which does not overlap with the second flow path and the third flow path if present, preferably at a position away from them as far as possible.

Accordingly, the invention also provides an electronic apparatus including the vapor chamber of the invention or the heat dissipation device of the invention, in which the heat source of the electronic apparatus is arranged at a position which does not overlap with the second flow path of the vapor chamber in a plan view.

EXAMPLES

Example 1

A sheet made of Cu having a size of 70 mm×120 mm was prepared as the first sheet. The size of the central region was set to 50 mm×100 mm. In this central region, the pillars were formed by etching. The pillars had cylindrical shapes each having a diameter of 0.6 mm, and the heights of the pillars were 0.125 mm. The pillars were arranged in the central region at intervals of 1.3 mm. The thickness t of the first sheet was set to 0.05 mm.

A sheet made of Cu having a size of 70 mm×120 mm was prepared as the second sheet. The size of the central region was set to 50 mm×100 mm. The projecting portions were formed in the central region by etching. The projecting portions were quadrangular prisms each having a bottom surface of 0.15 mm×0.15 mm and the heights thereof were 0.03 mm. The projecting portions were arranged in the central region at intervals of 0.15 mm. That is, the cross-sectional area of the first flow path was 0.0015 mm². The thickness t of the second sheet was set to 0.05 mm.

As the wick, a mesh having a size of 50 mm×100 mm and a thickness of 0.04 mm was used.

Water was used as the working fluid.

The vapor chamber was prepared by the following procedures using the first sheet, the second sheet, the wick, and the working fluid described above.

First, the second sheet, the wick, and the first sheet were stacked in this order from below, and outer peripheral portions thereof on four sides were joined together by brazing. Thus, a vapor chamber main body was prepared. At this time, the pillars formed on the first sheet were arranged inwardly, and the projecting portions formed on the second sheet were arranged inwardly. Further, the joint position and the wick height were adjusted such that the distance "a" from the position at which the sheets start the deformation to the terminal of the joint portion, the distance "b" between the first sheet and the wick at the position at which the sheets start the deformation, and the distance "c" between the second sheet and the wick at the position at which the sheets start the deformation are predetermined values (a=2000 μm, b=125 μm, c=30 μm), respectively. The height of the second flow path on the side of the projecting portions was 0.03 mm, the width from the side surfaces of the projecting portions to a contact point of the second sheet and the wick was 1.0 mm, and the cross-sectional area of the second flow path was 0.02 mm².

Next, one corner of four corners of the obtained vapor chamber main body was cut out, a Cu pipe was inserted thereinto, and then, the vapor chamber main body and the Cu pipe were fixed to each other by soldering. The Cu pipe was connected to a vacuum pump and a syringe containing the working fluid with a switching valve interposed therebetween. First, the switching valve was put in a state of connecting the inside of the vapor chamber and the vacuum pump, and the inside of the vapor chamber main body was depressurized. Thereafter, the valve was switched to connect the inside of the vapor chamber and the syringe containing the working fluid, a predetermined amount of the working fluid was injected into the vapor chamber, and then, the Cu pipe was crimped and sealed. The vapor chamber of Example 1 was thus obtained.

(Evaluation)

Heat Transportation Test

A heat transportation test was performed by installing a ceramic heater of 1.5×1.5 cm at the center of one short side portion of the vapor chamber and comparing a temperature of the vapor chamber on the surface opposite to the surface on which the ceramic heater was installed with a temperature of the vapor chamber on the other short side portion when heat quantity of 5 W was applied. At this time, a temperature difference was 5° C., and drying-out was not observed.

Since the vapor chamber of the invention has high heat transportation capacity, it can be used in a wide range of applications. In particular, the vapor chamber of the invention can be used, as a cooling device or the like for an electronic apparatus or the like, for applications requiring size reduction and efficient heat transportation.

REFERENCE SIGNS LIST

1 VAPOR CHAMBER
2 FIRST SHEET
3 SECOND SHEET
4 HOUSING
5 PILLAR
6 JOINT PORTION
7 PROJECTING PORTION
8 WICK
11 CENTRAL REGION
12 TERMINAL REGION
13 FIRST FLOW PATH
14 SECOND FLOW PATH
15 THIRD FLOW PATH

The invention claimed is:

1. A vapor chamber comprising:
a housing composed of a first sheet and a second sheet facing each other and having outer edge portions thereof joined to each other to define an internal space, the second sheet having a plurality of projecting portions on an inner surface thereof that faces the internal space;
a pillar between the first sheet and the second sheet and supporting the first sheet and the second sheet from the internal space;
a wick in the internal space of the housing; and
a working fluid in the internal space of the housing,
wherein a first flow path is formed between adjacent projecting portions of the plurality of projecting portions together with the wick,
as viewed in a plan view of the vapor chamber, a second flow path is formed in a terminal region between the pillar and the joined outer edge portions along at least one side of the housing, and the second flow path is surrounded by only the second sheet, the projecting portions, and an end of the wick, and
a cross-sectional area of the second flow path is larger than a cross-sectional area of the first flow path.

2. The vapor chamber according to claim 1, wherein a third flow path is formed by the first sheet, the second sheet, and the wick along in an inner side portion of the joined outer edge portions of the first sheet and the second sheet.

3. The vapor chamber according to claim 1, which satisfies the following:
0.001≤b/a≤1.000, and
0.001≤c/a≤0.200,
wherein "a" is a distance from a position at which the first sheet or the second sheet starts deformation to the joint portion,
"b" is a distance between the first sheet and the wick at the position at which the first sheet starts the deformation, and
"c" is a distance between the second sheet and the wick at the position at which the second sheet starts the deformation.

4. The vapor chamber according to claim 3, which satisfies the following:
0.020≤b/a≤0.400, and
0.001≤c/a≤0.050.

5. The vapor chamber according to claim 3, which satisfies the following:
0.050≤b/a≤0.100, and
0.006≤c/a≤0.020.

6. The vapor chamber according to claim 1, wherein a distance between the wick and the projecting portions is equal to or less than 100 µm.

7. The vapor chamber according to claim 1, wherein a central plane of the wick is located in a range of ±30 µm from a joint surface of the first sheet and the second sheet in a direction measured perpendicular to the inner surface of the second sheet and an opposing inner surface of the first sheet.

8. The vapor chamber according to claim 1, wherein a central plane of the wick is located in a range of ±20 µm from a joint surface of the first sheet and the second sheet in a direction measured perpendicular to the inner surface of the second sheet and an opposing inner surface of the first sheet.

9. The vapor chamber according to claim 1, wherein a central plane of the wick is located in a range of ±5 µm from a joint surface of the first sheet and the second sheet in a direction measured perpendicular to the inner surface of the second sheet and an opposing inner surface of the first sheet.

10. The vapor chamber according to claim 1, wherein the second flow path is formed in the terminal region between the pillar and the joined outer edge portions along at least two sides of the housing by only the second sheet, the projecting portions, and an end of the wick.

11. The vapor chamber according to claim 1, wherein the second flow path is formed in the terminal region between the pillar and the joined outer edge portions along all sides of the housing by only the second sheet, the projecting portions, and an end of the wick.

12. The vapor chamber according to claim 1, wherein the wick is interposed between the pillar and the plurality of projections.

13. A heat dissipation device that includes the vapor chamber according to claim 1.

14. An electronic apparatus comprising:
the vapor chamber according to claim 1, wherein the vapor chamber is arranged in the electronic apparatus at a position where a heat source of the electronic apparatus does not overlap with the second flow path of the vapor chamber in the plan view of the electronic apparatus.

* * * * *